Oct. 12, 1965 L. JULIE 3,212,026

STABILIZED WIEN BRIDGE OSCILLATOR

Filed March 21, 1963 2 Sheets-Sheet 1

INVENTOR.
LOEBE JULIE

BY Eugene S. Lovette

ATTORNEY

INVENTOR.
LOEBE JULIE

BY Eugene S. Lovette
ATTORNEY

United States Patent Office 3,212,026
Patented Oct. 12, 1965

3,212,026

STABILIZED WIEN BRIDGE OSCILLATOR

Loebe Julie, Riverdale, N.Y., assignor to Julie Research Laboratories, Inc., New York, N.Y., a corporation of New York Filed Mar. 21, 1963, Ser. No. 266,840
16 Claims. (Cl. 331—141)

This invention relates to an electrical oscillator characterized by stable outputs and, in particular, an oscillator capable of providing a pair of high gain output voltages of selected frequency, wherein each output voltage is stabilized for magnitudes of constant value.

The instant invention contemplates use of a bridge circuit as the feedback network of the oscillator. The use of a bridge circuit as an oscillator feedback network is known in the art. Such prior art oscillator is known as the Wien-bridge oscillator. The improved bridge oscillator incorporating the principles of the invention and the features thereof which distinguishes same from the Wien-bridge oscillator results in improved electrical operation beyond the scope of the prior art device, such as greater versatility, improved output accuracies and stabilities, and high gain capabilities than that achieved heretofore. Another material feature of the instant invention is that the oscillator provides two A.C. output voltages each of opposite polarity with respect to the other; hence, one output is designated as a high gain positive output and the other a high gain negative output.

It is the principal object of the instant invention to provide a bridge providing a high gain positive output and a high gain negative output, each characterized by high amplitude stability.

It is a further object of the invention to provide an oscillator regulated for variations in its pair of high gain outputs, whereby the magnitude of said outputs are stabilized at a selected frequency of operation at constant amplitude levels.

It is a further object of the invention to provide means for regulating and stabilizing an oscillator against short term fluctuations equally as well as against long term drifts and variations.

Further objects and advantages will become apparent from the following description of the invention taken in conjunction with the figures, in which.

Figure 3:
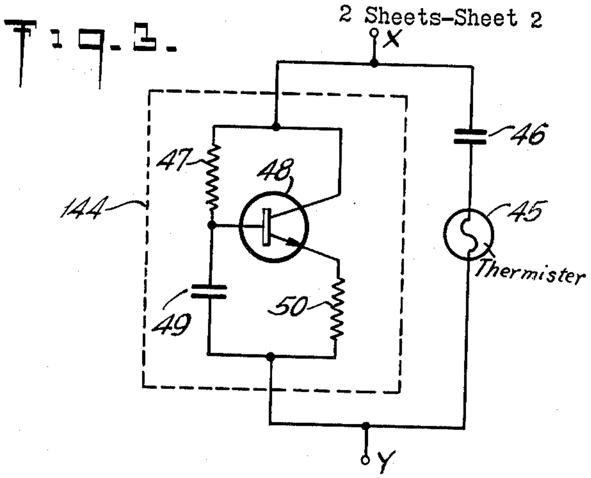
Figure 5:
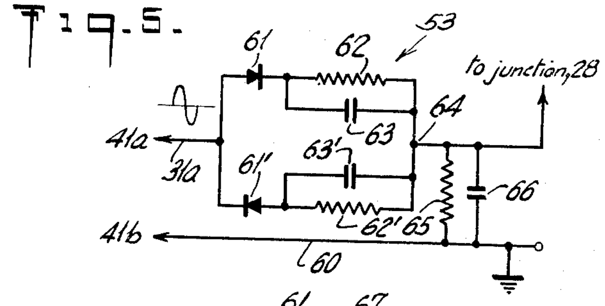
Figure 6:
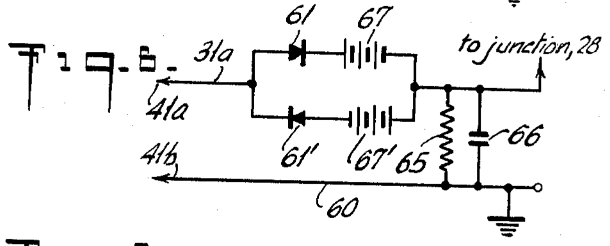
Figure 7:
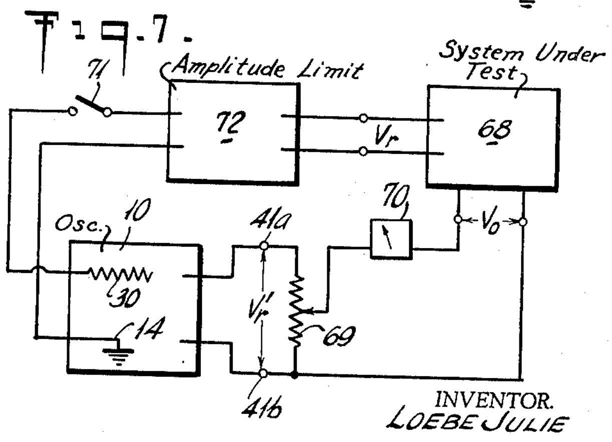

FIG. 3 discloses another embodiment of amplitude sensing and stabilizing means incorporating in this instance a transistor network as a load impedance;

FIGS. 4A, 4B, 4C and 4D illustrate schematically various alternative amplitude sensing and stabilizing means capable of regulating the oscillator circuit for short term fluctuations as well as long term variations;

FIGS. 5 and 6 illustrate schematically a pair of similar circuits for sensing short term fluctuations and stabilizing the oscillator circuit against such fluctuations; and FIG. 7 illustrates schematically the use of the oscillator in a system for measuring an A.C. signal potentiometrically.

Figure 1:
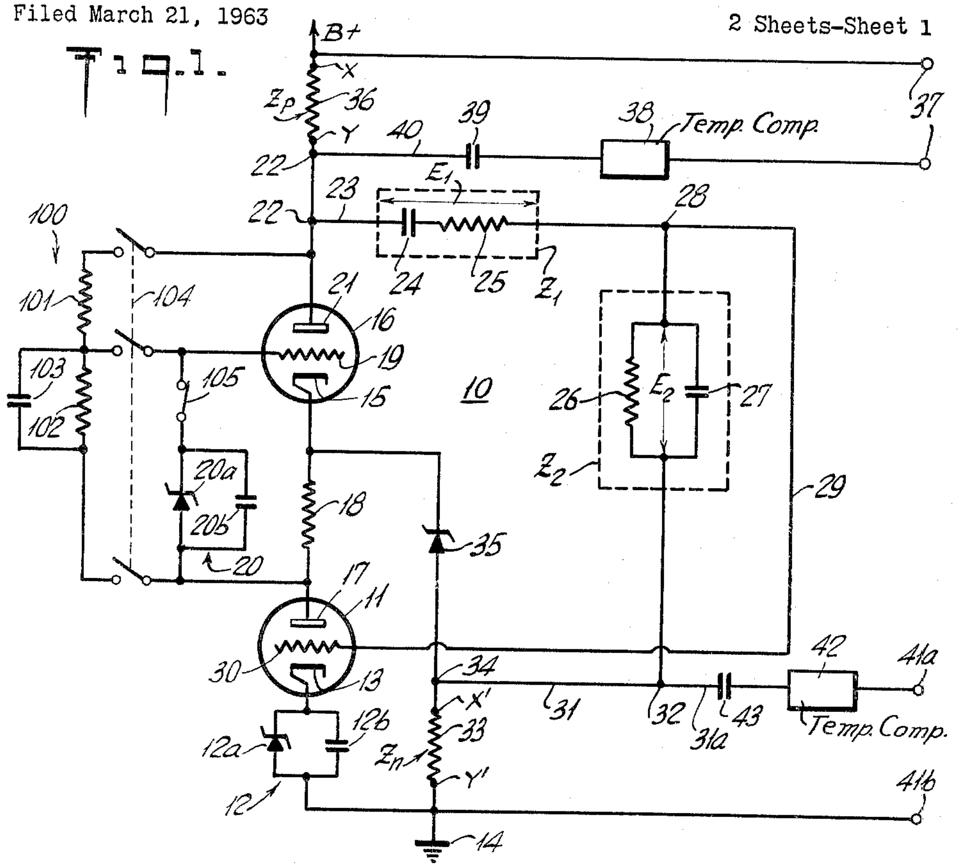
FIG. 1 illustrates schematically the basic circuit of the bridge oscillator in accordance with the principles of the invention.

Reference is now made to FIG. 1 which depicts an oscillator 10 in accordance with the invention. An oscillator tube 11 has D.C. biasing means 12 connected between tube cathode 13 and ground 14. The cathode 15 of a second tube 16 is connected to the plate 17 of tube 11 through a cathode resistor 18. Grid 19 of tube 16 is connected to plate 17 through grid biasing means 20. Plate 21 of tube 16 is connected to a resistor-capacitor frequency selective bridge. The connection is made from junction 22 and connecting wire 23 to an arm $Z_1$ of the bridge. Arm $Z_1$ is made up of a capacitor 24 in series with a resistor 25. A second bridge arm $Z_2$ is made up of a resistor 26 in parallel with a capacitor 27. Arms $Z_1$ and $Z_2$ are connected together at a common junction 28. Junction 28 feeds back through a connecting wire 29 to grid 30 of tube 11. The negative side of arm $Z_2$ connects to a connecting wire 31 at junction 32 to make connection to an output resistor 33 at junction 34. The negative side of arm $Z_2$ is also coupled to the plate 17 of tube 11 from junction 34 through D.C. zener supply means 35 and resistor 18. The lower side of resistor 33 is grounded at 14. An output resistor 36 is in the plate circuit of tube 16 and is connected from junction 22 to the positive side of a B+ supply. It will be understood that the negative side of B+ supply is grounded to 14. Hence, point 14 is at zero D.C. potential.

Resistors 33 and 36 also form the other two arms of the frequency selective bridge. Tube 11 serves as the oscillator element and tube 16 serves as a phase inverter and suitable load for oscillator 11. The bridge network constitutes the feedback circuit from tube 16 to the grid input of tube 11. The foregoing circuit provides two high gain output voltages, one across resistor 36 (sometimes referred to herein as the high gain positive voltage) and the other across resistor 33 (sometimes referred to herein as the high gain negative output). Hence, resistors 36, 33 are sometimes referred to herein as $Z_p$ and $Z_n$, respectively. A.C. signalwise, the two outputs are 180 degrees out of phase with respect to each other. The positive output voltage is taken from output terminals 37. Temperature compensating means 38 and a D.C. blocking capacitor 39 are included in one of the output lines 40 of positive output 37. The negative output is taken from output terminals 41*a*, *b*. Temperature compensating means 42 and a D.C. blocking capacitor 43 are included in one of the output lines 31*a* of negative output 41*a*.

The bridge feeds back an A.C. input signal to tube 11 of desired frequency. Upon the selection of suitable bridge parameters, stable oscillation is obtained and sustained by reason of providing an input signal to grid 30 of tube 11 of suitable amplitude, phase and frequency with respect to the output signal at junction 22. Essentially, the frequency of oscillation "*fo*" will depend upon the parameter values selected for the two capacitor-resistor bridge arms $Z_1$ and $Z_2$ and this may be expressed as follows:

$$fo=\frac{1}{2\pi\sqrt{C24R25\times R26C27}} \quad (1)$$

Assuming that the capacitance parameters for capacitors 22 and 25 are equal, and that the resistance parameters for resistors 23 and 24 are equal, the frequency of oscillation from Equation 1 becomes:

$$fo=\frac{1}{2\pi RC} \qquad (2)$$

In the following discussion, the A.C. signal voltage drops across arms $Z_1$, $Z_2$ are designated, respectively, as $E_1$ and $E_2$.

At the natural frequency of the bridge network, $Wo=1/RC$; hence, the individual impedances $Z_1$ and $Z_2$ may be expressed in terms of R and C as contemplated by Equation 2 as follows:

$$Z_1=R+\frac{1}{jWC}$$

but with $W=Wo$, then $$Z_1=R-jR=R(1-j) \qquad (3)$$

$$Z_2=\frac{\frac{R}{jWC}}{R+\frac{1}{jWC}}=\frac{-jR^2}{R(1-j)}=\frac{-jR}{(1-j)}$$

$$Z_2=\frac{-jR(1+j)}{(1-j)(1+j)}=\frac{R(1-j)}{2}=\frac{R}{2}(1-j) \qquad (4)$$

Furthermore, at balance, the bridge may be considered as a voltage divider whereby the voltage ratio of $E_2/E_1+E_2$ is equal to the ratio of the corresponding impedances, i.e., $Z_2/Z_1+Z_2$. Hence, from Equations 3 and 4

$$\frac{E_2}{E_1+E_2}=\frac{\frac{R}{2}(1-j)}{R(1-j)+\frac{R}{2}(1-j)}=\frac{\frac{1}{2}R}{\frac{3}{2}R}=\frac{1}{3} \qquad (5)$$

Equation 5 holds that the A.C. voltage across the parallel RC bridge arm $Z_2$ is one-third the A.C. voltage across the combination of arms $Z_1+Z_2$ when frequency $f=fo$. Since ouptut resistors 33, 36 form the other half of the frequency sensitive bridge, for a balanced bridge condition, these arms also define the same ratio, i.e., $$\frac{R_{33}}{R_{33}+R_{36}}=\frac{1}{3}$$

and this ratio holds if $R_{36}=2R_{33}$, i.e., $Z_p=2Z_n$.

Each tube 11, 16 produces a 180 degrees phase shift. Accordingly, a positive A.C. input signal to the grid of tube 11 provides a high gain negative A.C. output at the plate of tube 11. This negative output is fed into the grid of tube 16 to provide a high gain positive A.C. output at the plate of tube 16. Considering only the A.C. signal potentials, the frequency selective network is connected from the plate of tube 16 to the plate of tube 11. The A.C. signal drop across resistor 18 is very small in comparison to the magnitude of the A.C. signal at plate 17. Biasing means 20 is selected to provide a virtual A.C. signal short between grid 19 of tube 16 and plate 17. Hence, the A.C. potential at grid 19, plate 17 and cathode 15 (the top end of resistor 18) is the same. Furthermore, since zener supply 35 is a virtual A.C. short, junctions 32, 34 are also at the same A.C. potential as plate 17. Consequently, the total A.C. signal across tube 16 appears across the bridge as $E_1+E_2$. As an example, if tube 16 has a signal gain of 2, an A.C. signal of $-1$ volt at the plate of tube 11 produces a signal of $+2$ volts at the plate of tube 16, which amounts to a total of $+3$ volts signal potential across the arms $Z_1$ and $Z_2$, that is to say, $E_1+E_2=+3$ volts. At bridge balance, there is a zero potential difference between junctions 28 and 14 of the bridge. Hence, the signal voltage at the grid of tube 11 is the same as that at ground 14. Similarly, at balance, $E_2=\frac{1}{3}(E_1+E_2)$ from Equation 5, hence with $E_1+E_2=3$ volts, then the signal voltage $E_2$ at junction 28 (at grid 30) is $+1$ volt; and the same signal level of $+1$ volt is at ground 14. Furthermore, the bridge arm $Z_2$ has its negative side at junction 32; and as noted before, junction 32 is at the same signal potential as the plate of tube 11. Hence, the plate of tube 11 is at a $-1$ volt level with respect to A.C. ground.

In actual usage, the high gain signal voltage at the plate of tube 16 is determined by an impedance ratio of the two branch arms $Z_{36}$ and $Z_{33}$. At balance, the signal voltage at the high gain positive junction 22 is a function of the ratio $Z_{36}/Z_{33}$ times the signal voltage at the high gain negative output at junction 34. As a particular example, consider a pentode-triode for tubes 11, 16, respectively, wherein the pentode half provides a gain of approximately 600. As previously noted, at the natural frequency of the bridge, the voltage ratio $E_2/E_1+E_2$ must be one-third, and at bridge balance, $Z_{36}=2Z_{33}$. Consequently, if a $+1$ millivolt signal with respect to A.C. ground is injected into tube 11, a signal of $-600$ millivolts will appear at the plate of tube 11, which is the A.C. potential, the high gain negative output, at junction 34 with respect to ground. By reason of the bridge divider characteristics, the high gain positive output at the plate of tube 16 will be $Z_{36}/Z_{33}\times 600$ mv. or $+1200$ millivolts, which is the A.C. potential at junction 22a to ground. The total signal voltage between the plate of tube 11 and the plate of tube 16 with respect to ground appears across the bridge as $E_1+E_2=1800$ millivolts. Hence, the signal voltage $E_2$ appearing at junction 28 is $+600$ millivolts. With the bridge at balance, the signal voltage potential at ground junction 14 is also $+600$ millivolts. This means that the input signal $E_2$ fed back to grid 30 is at the same signal level as cathode 13. Cathode 13 is at ground by reason of the A.C. short provided by the zener in bias means 12. The result is a zero feedback signal and consequently system oscillation will not be sustained.

If in the foregoing example the value of $Z_{36}$ is increased to make the ratio $Z_{36}/Z_{33}$ slightly greater than 2, a slightly higher positive signal voltage, for example, $+1203$ millivolts, is produced at junction 22 with respect to ground by bridge-divider characteristics. This provides a total signal voltage difference across the bridge $E_1+E_2$ of 1803 millivolts, which means that voltage $E_2$ is $+601$ millivolts with respect to A.C. ground by bridge-divider characteristics, Equation 5. However, the signal voltage at junction 34 remains at $-600$ millivolts with respect to A.C. ground. As a result, there is a net signal voltage of $+1$ millivolt at junction 28 with respect to A.C. ground. This $+1$ millivolt is fed back into grid 30 of tube 11 to provide the feedback signal for sustaining oscillation of the circuit. On the other hand, if the increased value of $Z_{36}$ is too great, the ratio of $Z_{36}/Z_{33}$ times the voltage of the high gain negative output becomes increasingly large, thereby causing an increasingly large feedback signal. This large signal is further amplified by the high gain pentode 11 to result in a further increase of feedback signal. The progressively increasing level of such voltages will continue until oscillation stops by reason of the on-set of nonlinearity of the active sections of the circuit. Consequently, it is seen that if the value of load resistance $R_{36}$ ($Z_p$) is selectively chosen to provide a small feedback signal, oscillations will be sustained, whereas a value of $R_{36}$ relative to the load resistance $R_{33}$ ($Z_n$) which is too high will result in extinction of oscillations.

Within a given range of frequency operation, the frequency sensitive bridge may be tuned for a selected frequency of the range by regulation of the values of capacitors 24, 27. On the other hand, the entire range of frequency of operation may be shifted to another range by selecting different values for the resistors $R_{25}$ and $R_{26}$.

The three zener supplies 12, 20 and 35 provide D.C. coupling in the oscillator-bridge circuit. The zener elements *12a*, *20a*, *35* are effectively A.C. shorts, that is to say, they appear as zero impedance connections for A.C. signals conducted thereby. Bias means 12 includes zener element 12*a* shunted by a capacitor 12*b*. Zener element 12*a* is selected to provide a suitable positive D.C. bias at cathode 13 with respect to ground. Capacitor 12*b* filters out noise distortions and fluctuations developed by zener element 12*a*. Similarly, the zener-capacitor parallel combination 20*a*, *b* provides a desired D.C. bias at grid 19 which is at a lower positive potential with respect to the D.C. potential at cathode 15. Although zener element 20*a* and resistor 18 inject virtually a zero A.C. potential drop between grid 19 and cathode 15, resistor 18 does inject a D.C. drop between its top and bottom terminals. Hence, zener element 20*a* is designed to provide a suitable rise in D.C. potential in order to bias grid 19 close to the D.C. level of cathode 15, but at a slightly lower potential. Capacitor 20*b* is a smoothing element for filtering noise distortions and fluctuations developed by zener element 20*a*.

The potential of cathode 15 is raised to a desired D.C. level above the D.C. level of junction 34 by zener element 35. The plate 17 is at a lower D.C. level as determined by the D.C. drop across resistor 18. Diode 35 also serves to clip-off positive surge pulses that might appear at this point of a circuit during oscillator operation.

If the zener supply means 20, particularly at high frequencies of operation, persist in injecting noise harmonics or other distortions into the circuit, alternative D.C. coupling bias means 100 may be used in lieu of the zener-capacitor combination 20. Bias means 100 is essentially a voltage divider and includes connected resistors 101 and 102 and a capacitor 103 shunting resistor 102. The three terminals of divider means 100 are connected to plate 21, grid 19 and plate 17, respectively, upon removal of bias means 20 by closing ganged switch 104 and opening switch 105. Resistors 101 and 102 define a voltage divider placing grid 19 at a proper D.C. level with respect to cathode 15. Capacitor 103 is designed to provide a zero impedance A.C. short at the frequency of oscillation for the A.C. signal fed from plate 17 to grid 19.

Conventional temperature compensation means 38, 42 are introduced in output lines 40, 31*a* to maintain the output voltages constant regardless of variations of surrounding temperature.

It is one aspect of the invention to control the ratio of $R_{36}/R_{33}$ in order to sustain system oscillation and also to maintain the generated outputs at a desired amplitude of fixed value without any variations. This may be accomplished by regulating the parameter value of $R_{36}$ while holding $R_{33}$ constant; or conversely, regulating the value of $R_{33}$ while holding $R_{36}$ constant. It is thus one aspect of the invention to regulate the ratio of $Z_{36}/Z_{33}$ to sustain system operation at a desired amplitude of oscillation. Going back to the foregoing example, if the proposed regulation is capable of maintaining a ratio $Z_p/Z_n$ at a value of 1203/600, the bridge oscillator will provide a constant feedback signal of +1 millivolt to tube 11, thereby resulting in sustained oscillations of regulated magnitude.

Figure 2A:
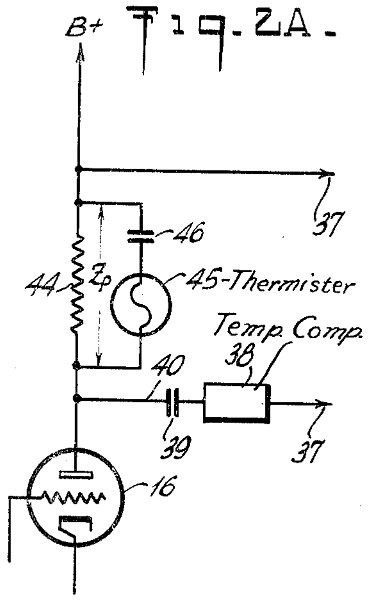
FIG. 2A illustrates schematically amplitude sensing and stabilizing means for carrying out the objects of the invention.
Figure 2B:
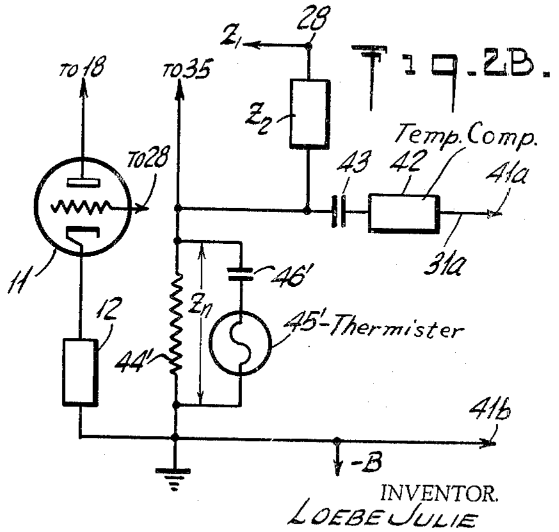
FIG. 2B is an embodiment of the amplitude sensing and stabilizing means similar to that of FIG. 2A, but incorporated in a different portion of the oscillator circuit.

FIGS. 2A, 2B, 3 and 4 illustrate means for establishing such regulation. FIGS. 2A and 2B illustrate a resistor 44 (44′ in FIG. 2B) bridged by a thermistor element 45 (45′ in FIG. 2B) in series with a capacitor 46 (46′ in FIG. 2B). This amplitude stabilization circuit may be inserted either in the high gain positive output portion of the oscillator as depicted in FIG. 2A, or in the high gain negative output portion of the circuit as depicted in FIG. 2B.

When the stalilizing circuit is inserted in the high gain positive output, FIG. 2A, load resistor 36 is replaced by resistor 44 and the series elements 45, 46 bridge resistor 44. Hence, the bridge arm ratio $Z_p/Z_n$ is now determined by the parallel-circuit stabilizing network and the fixed value resistance $R_{33}$. In FIG. 2A, thermistor element 45 has a negative thermal coefficient of resistance, whereby its resistance decreases with an increase of temperature. The temperature of a thermistor element is determined by the root-means-square value of current flow therethrough. Capacitor 46 blocks D.C. flow through thermistor 45 to render same sensitive to A.C. signal variations only. Accordingly, if the gain of the oscillator circuit is increased due to external conditions or, otherwise, the A.C. current flow through the regulating element 45 increases thereby causing a higher current flow through thermistor element 45. This has the effect of decreasing thermistor resistance. Since element 45 is in parallel with resistor 44, the combined parallel resistance of the regulating network decreases so as to decrease the effective resistance of arm $Z_p$. This results in a decrease of the ratio $Z_p/Z_n$ to decrease the feedback signal $E_2$ to counterbalance the original increase of circuit gain or input to tube 11, whereby circuit operation returns to provide a constant amplitude output. The value of capacitor 46 is sufficiently large to avoid spurious phase shifts at the design frequency of oscillation.

When amplitude stabilization is employed in the high gain negative output circuit, load resistor 33 is replaced by resistor 44′ and series elements 45′, 46′ are connected across resistor 44′, FIG. 2B. The bridge arm ratio $Z_p/Z_n$ is now determined by the fixed value resistance $R_{36}$ and the parallel-circuit regulating network. In this instance, the thermistor element 45′ is selected to have a positive thermal coefficient of resistance, whereby its resistance increases with an increase of temperature. Accordingly, any increase in the A.C. gain of the circuit or an increase in the A.C. output voltage results in an increase of thermistor resistance, which increases the parallel resistance combination $Z_n$ of FIG. 2B, thereby effecting a decrease in the ratio $Z_p/Z_n$. This results in a decrease of the feedback input to tube 11 which returns the circuit outputs to desired level.

Conversely, whenever the A.C. gain or output level of the oscillator system decreases, the foregoing regulating networks. FIG. 2A or FIG. 2B, operate to increase the feedback input to tube 11 to correct for the decrease of output level so as to return system output to desired amplitude.

FIG. 3 illustrates a second regulating circuit for maintaining the output levels of the oscillating circuit at a fixed amplitude. In FIG. 3, thermistor element 45 and series connected D.C. blocking capacitor 46 are connected across a transistor bridge 144. Transistor bridge 144 functions as load impedance of relatively high value in the manner of resistor 44 of FIG. 2A. Transistor bridge 144 consists of resistor 47 connected to the collector terminal of an NPN transistor 48. One side of thermistor 45 is also connected to said terminal. The base-emitter circuit of transistor 48 includes a capacitor 49 connected to the base terminal at the common junction with the low side of resistor 47. The other side of capacitor 49 connects to common terminal Y with one side of an emitter-resistor 50 and the second side of thermistor 45. Resistor 50 is in series with the emitter. The foregoing described network replaces resistor 36 in FIG. 1 by connecting the individual terminals X–Y of FIG. 3 to respective terminals X–Y of FIG. 1. The transistor circuit 144 of FIG. 3 presents a relatively high A.C. impedance and lower D.C. impedance to current flow from terminal X to terminal Y. As in FIG. 2A, this stabilizing network regulates for A.C. signal variations because D.C. is blocked against flow through element 45 by capacitor 46. Consequently, any external or circuit change causing an increase of the feedback signal or to the A.C. output amplitude of the oscillating system will manifest itself by a decrease of thermistor element resistance. This will decrease the combination resistance of the parallel network between terminals X and Y. A decrease of the impedance between terminals X–Y effectively decreases the impedance $Z_p$ of the ratio $Z_p/Z_n$ to decrease the feedback signal to tube 11 which returns the oscillator circuit to the desired level of output.

Conversely, a circuit variation causing a drop in feedback signal or system output voltage is regulated to return the system to its desired value of output magnitude.

As an alternative embodiment, a regulating network as depicted in FIG. 3 may be used in the high gain negative output of oscillator 10. In this instance, the FIG. 3 network should employ a capacitor 46 in series with a thermistor element 45′ with a positive thermal coefficient of resistance in order to provide an increase to impedance $Z_n$ to regulate the output downwardly and, conversely, to provide a decrease of $Z_n$ to regulate the output level upwardly. When employed in the high gain negative output, the impedance $Z_n$ of FIG. 1, resistor 33, is replaced by the transistor bridge 144-thermistor element parallel combination by connecting the individual X–Y terminals of same to X′–Y′ of the FIG. 1 circuit. An NPN transistor network 144 as depicted in FIG. 3 satisfies the D.C. polarity conditions at terminal X′–Y′ of FIG. 1 because junction 34 is D.C. positive with respect to D.C. ground potential at junction 14. As noted before, FIG. 3 is basically a stabilizing network sensitive to variations in the A.C. signal to regulate the oscillator circuit for such variations.

Figure 4A:
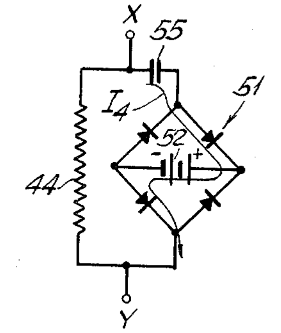

FIG. 4A illustrates another amplitude stabilization circuit. In this embodiment, resistor 36 of FIG. 1 is replaced by the network shown in FIG. 4A by means of connecting the individual terminals X–Y of FIG. 4A to the respective terminals X–Y of FIG. 1. The network of FIG. 4A includes a resistor 44 in parallel across a diode bridge 51. Diode bridge 51 includes four diodes interconnected with a fixed D.C. source 52. Diode bridge 51 also includes a D.C. blocking capacitor 55 to render the circuit sensitive to A.C. signal variations only in order to regulate for such variations. When oscillator circuit operation provides its rated output voltage of fixed magnitude, the drop across resistor 44 is greater than the bucking voltage provided by source 52. Hence, an A.C. signal current $I_4$ flows in diode loop 51 as indicated. Diode loop 51 acts as a resistor in parallel across resistor 44, wherein the value of resistance 51 is a function of the voltage of source 52 divided by current $I_4$ through diode loop 51. As will be seen, this loop resistance 51 is actually a variable resistance having a negative temperature coefficient. The parallel combination of resistance 51 and resistor 44 represents the load impedance arm $Z_p$ of the oscillator network. When the output level of the oscillator circuit rises and thereby requires a decreased value of $Z_p$ for regulation, the voltage across terminals X–Y causes more current $I_4$ flow in diode loop 51 by virtue of the increased gain or output level of the oscillator circuit. The increased current $I_4$ through diode loop 51 decreases the effective resistance of such loop because of the constant voltage source 52. This lowers the effective resistance of the parallel combination constituting arm $Z_p$ to return the circuit to its stabilized rated voltage.

Conversely, when a circuit operation variation causes a drop in output, it requires an increase of feedback signal. Now the decreasing value of branch current $I_4$ through diode loop 51 increases the effective resistance of diode loop 51 to increase the parallel combination of resistance $Z_p$ across terminals X–Y, thereby resulting in an increased feedback signal to return the circuit to its rated output voltage.

Figure 4B:
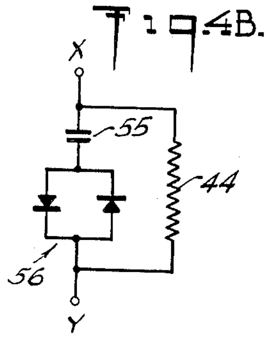
Figure 4C:
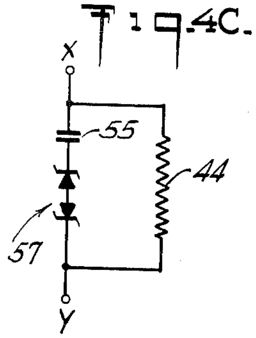

FIG. 4B illustrates an amplitude sensing network wherein parallel connected back-to-back diodes 56 are employed in lieu of the negative temperature coefficient of resistance thermistor 45. In this embodiment, back-to-back parallel diodes are in series with D.C. blocking capacitor 55 and this series combination is connected across resistor 44 to define the parallel resistor network establishing load impedance arm $Z_p$. Terminals X–Y of FIG. 4B are connected to the respective like-desiginated terminals of FIG. 1 and resistance 36 shown in FIG. 1 is removed. Back-to-back diodes 56 and capacitor 55 in series therewith essentially define an A.C. amplitude sensing device characterized by a negative temperature coefficient of resistance, whereby an increase or decrease in the A.C. signal across $Z_p$ results in a decrease and increase, respectively, of effective impedance $Z_p$ to provide the desired feedback regulation. The circuit of FIG. 4C is another amplitude sensing and regulating embodiment operating in the same manner and serving the same purpose. In FIG. 4C, a double anode zener 57 is in series with capacitor 55 and the combination bridges resistor 44 to define arm $Z_p$.

Figure 4D:
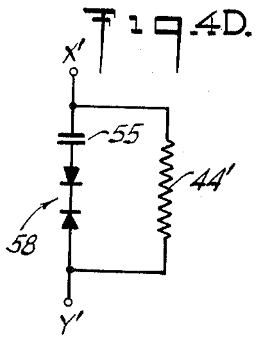

FIG. 4D illustrates the semi-conductor stabilizing arrangement for insertion in the high gain negative portion of the circuit. This involves series connected back-to-back diodes 58 in series with capacitor 55 and the combination is connected across resistor 44′ to define the parallel impedance establishing arm $Z_n$ which is used in lieu of resistor 33. Hence, terminals X′–Y′ of FIG. 4D are connected to respective terminals X′–Y′ in FIG. 1 and resistor 33 is not used. The series back-to-back diodes 58 with series capacitor 55 define an A.C. amplitude sensitive element characterized by a positive temperature coefficient of resistance. Hence, upon an increase signal variation, the effective resistance of diodes 58 in series with blocking capacitor 55 results in increasing resistance to increase the effective resistance of $Z_n$, whereby feedback of diminishing value is injected into tube 11 to provide desired feedback regulation. Conversely, when the A.C. variation is a decreased signal, the effective resistance of $Z_n$ decreases, whereby feedback is increased to provide desired regulation to return oscillations to the fixed value of magnitude.

The regulating circuits depicted in FIGS. 2A through 3 provide automatic regulation of the ratio $Z_p/Z_n$ to stabilize the oscillator outputs at a constant amplitude. However, these regulating circuits are not very effective for short term fluctuations. A short term fluctuation may arise from noise, pick-up of external oscillations or other unaccountable factors in the system. For an extremely stable and precise oscillator operation, the system should be stabilized for variations caused by short term fluctuations, because these fluctuations will cause sudden amplitude variations to the outputs of oscillator 10.

The embodiments of FIGS. 4A through 4D will react instantaneously to short term fluctuations as well as to long time constant drifts to regulate the value of the load impedance ratio. On the other hand, the embodiments employing thermistor elements 45, 45′ will not regulate to correct instantaneously for short term fluctuations. The time constant of a thermistor element is relatively longer than that of the fluctuations caused by noise or random pick-up distortions. Consequently, the output amplitude variations caused by sudden fluctuations will occur before the thermistor element has a chance to regulate the circuit.

The embodiment of FIG. 5 may be used in the oscillator of FIG. 1 to provide amplitude stabilization to correct for changes caused by short term fluctuations. When used in conjunction with the amplitude stabilizing networks employing a thermistor element, oscillator 10 is then stabilized both for slow time drifts as well as short term fluctuations.

In FIG. 5, the individual terminals at the left (depicted by arrows) are connected to output terminals *41a*, *41b*, respectively, of FIG. 1. Line 60 is grounded. The upper line is a continuation of line 31a and includes a diode network 53 to provide unidirectional current flow for successive positive and negative halves of the oscillation cycle. Diode network 53 includes two parallel branches. Each branch has a diode 61 in series with parallel RC elements 62, 63. The primed elements 61′, 62′, 63′ are in the lower branch. A common junction 64 of the network connects with a parallel RC combination of resistor 65 and capacitor 66; the lower ends of which are grounded. Junction 64 is connected to junction 28. Any A.C. potential developed across terminals 44a, b and large enough to override the charged RC combinations 62–63 and 62′–63′, will result in unidirectional current flow through diode network 53 and through resistor 65. The voltage developed across resistor 65 is fed back to grid 30 of tube 11.

The foregoing FIG. 5 circuit acts as an amplitude sensing device responsive to short term fluctuations. The RC combinations 62–63 and 62′–63′ are designed to be in balanced opposition voltagewise with long time constant characteristics. Resistors 62, 62′ may be in the order of 10 megohms. When oscillator 10 is experiencing rated operation, the parallel RC combinations 62–63 and 62′–63′ charge up to the R.M.S. level of the high gain negative output of constant amplitude at terminals 41a, b. Capacitors 63, 63′ hold their respective voltages to balance out the successive positive-negative half cycles of the high gain output developed across output resistor 33 when the oscillator is providing its rated output. Hence, no regulating signal is fed back to junction 28 while the output sensed at terminals 41a, b is opposed by the equally charged RC bucking combinations 62–63 and 62′–63′. The voltage at junction 64 applied by the two RC combinations 62–63 and 62′–63′ are equal and opposite when oscillator 10 is providing its rated outputs of constant magnitude.

Should any noise, pick-up or other factor produce a short term fluctuation in the oscillator output, a sudden surge signal will be conducted through diode network 53. As a surge signal, its instantaneous value will be greater than the D.C. level to which capacitors 63, 63′ are charged. The surge fluctuation appears across resistor 65. The developed noise or pick-up fluctuation will include a fundamental signal and harmonics of the main fundamental, i.e., the frequency of oscillation. Capacitor 66 is designed to smooth out these fluctuations into the frequency of oscillation. Other types of filtering means can be used in lieu of capacitor 66. This will depend upon the degree and type of filtering desired. Since the foregoing circuit is connected across the high gain negative output, the signal fed back to junction 28 by the network of FIG. 5 is a negative phase feedback signal which is the proper polarity to counteract the sudden short term fluctuation arising in the output of the oscillator system. The selected values for the circuit of FIG. 5 will depend upon the requirements of the particular circuit to produce the desired negative feedback and also at the same time filter out harmonic distortions in the surge signal to one thousandth of the negative feedback voltage or a total of 0.1% which is well within the limit of stable and precision oscillator requirements.

FIG. 6 is a modification of the FIG. 5 network; hence, its operation is the same, i.e., it is used to stabilize against short term fluctuations which are too fast for the thermistor networks to regulate. In FIG. 6, batteries 67, 67′ replace the RC parallel combinations 62–63 and 62′–63′ of FIG. 5. Batteries 67, 67′ provide respective D.C. levels equal to the positive-negative half-cycles of output amplitude of oscillator 10 across terminals 41a, b. Batteries 67, 67′ pass surge signals when the signal across arm $Z_n$ overrides the bucking batteries 67, 67′ so as to provide a negative feedback to grid 30 of tube 11 by means of junction 28. It will be understood that short term fluctuations are always surge signals of greater magnitude than the rated output amplitude of oscillation. Accordingly, the circuits of FIGS. 5 and 6 do not compensate for a decreasing output signal below the rated value of operation.

With respect to the amplitude sensing devices of FIGS. 5 and 6, it is noted that the feedback outputs from these correcting circuits are injected back into grid 30 of tube 11. It will be understood that amplitude sensing circuits as shown in FIGS. 5 and 6 may be located in other portions of the oscillator circuit in order to sense amplitude surges. In addition, outputs from the corrective circuits of FIGS. 5 and 6 may be fed back into grid 30 or elsewhere in the oscillator circuit provided that the signal fed back is of proper polarity. For example, to regulate for a positive surge requires a negative feedback (with respect to $E_2$) to grid 30, whereas it would require a positive feedback (with respect to $E_2$) when applied to grid 19, that is to say, a feedback which is 180 degrees out of phase with the feedback normally injected into grid 19 from plate 17.

An oscillator as depicted in FIG. 1 and incorporating suitable amplitude stabilization means, for example, as depicted in any one of the FIGS. 2A through 4D, and together with short term fluctuation sensing means, such as FIG. 5 or 6, if needed, may be used as an amplitude stabilizing control for testing an external system 68 as shown in FIG. 7.

The symbol $V_o$ depicts the output A.C. voltage from system 68 under test. Testing of voltage $V_o$ contemplates measuring same potentiometrically. This means measuring voltage $V_o$ by nulling same against a reference A.C. voltage $V_r$ without loading down the system output $V_o$. Before such potentiometrical test can be made, the reference voltage $V_r$, which may be obtained from system 68 or any other available generator, has to be adjusted so that its amplitude, frequency and phase is exactly equal to the amplitude, frequency and phase of $V_o$. As practiced hereinbefore, this requires that reference signal $V_r$ undergo some or all of the following operations, depending upon the accuracy and stability of the test: noise filtering, amplitude limiting, filtering of short duration amplitude fluctuations, elimination of harmonics and other operations depending upon the particular test. One advantage of an oscillator 10 in accordance with the invention is its capability of accomplishing all of the necessary filtering and pretesting amplitude limiting operations without additional supplementary circuitry. By means of a closed loop as depicted in FIG. 7, oscillator 10 will provide the required signal $V_r'$ at its output for potentiometrically measuring same against $V_o$. In this instance, it is assumed that the reference signal $V_r$ is taken from system 68 under test. This establishes that the frequencies of $V_r$ and $V_r'$ are the same as the frequency of $V_o$. The output of oscillator 10 is applied to a voltage divider 69 to obtain the required voltage amplitude for nulling meter 70 upon comparing the two voltages $V_r'$ and $V_o$.

The potentiometric measurement of voltage $V_o$ with the use of oscillator 10 is carried out as follows. The frequency selective bridge network of oscillator 10 is adjusted to provide a frequency of oscillation equal to or at least close to the frequency of voltage $V_o$. For convenience, voltage $V_r$ is taken from system 68; hence, it has the same frequency as $V_o$. Oscillator 10 is set into oscillation; switch 71 is open. One of the impedance arms $Z_p$ or $Z_n$ is adjusted until oscillations cease. This requires decreasing the ratio $Z_p/Z_n$ until a zero feedback obtains, whereby oscillations are no longer sustained. Switch 71 is closed to connect reference signal $V_r$ to grid 30 of oscillator tube 11. The magnitude of $V_r$ is increased until system oscillation commences. Upon commencement of system oscillation, heat will be generated by the oscillator tubes and other operating components thereto to heat the thermistor element of the amplitude stabilization network. This reactivates the stabilization means, whereby the thermistor element reassumes its regulating properties to control resistor $Z_p$ or $Z_n$ (depending upon the arrangement employed) so as to stabilize the output amplitude of oscillator 10 at a constant level. Furthermore, use of amplitude sensing means, such as FIG. 5 or 6, assures stabilization against short duration fluctuations and also against harmonic distortions.

The output $V_r'$ from oscillator 10 may be measured or calibrated by conventional means to phase match same against output $V_o$. If the phase of $V_o$ and $V_r'$ are not alike or matched, spurious null readings will result. Phase alignment or matching may be effected by tuning one of the oscillator bridge capacitors 24 or 27 until a phase match between $V_r'$ and $V_o$ is detected. The amplitude of $V_r'$ may be readily calibrated by conventional means so as to assure the capability of a potentiometric null at meter 70 when $V_o$ under test is being compared to $V_r'$.

As an example of such operation, and continuing from the illustrative example previously set forth in the description, assume 1 millivolt of input to the grid of tube 11, a tube gain of 600, and a ratio of $Z_p/Z_n$ producing 1200 millivolts at the high gain positive output, junction 22. It has been previously shown that for this example, the potential between junction 28 and ground 14 is zero, that is to say, no feedback voltage to sustain oscillation. However, if 1 millivolt of $V_r$ is applied to the grid of tube 11, the system continues to function as an oscillator since the input voltage to the grid of tube 11 is being supplied from an external source even though the feedback voltage is zero. Should $V_r$ increase, for example, to a level of 1.1 millivolts, the increase in voltage would cause the thermistor element to regulate the impedance value of $Z_p$ or $Z_n$ so as to maintain the output amplitude at a constant value. Similarly, should any short term fluctuation occur, the amplitude sensing circuit (FIG. 5 or 6) would regulate the system to provide negative feedback to adjust instantaneously the output amplitude back to the desired constant level. In other words, oscillator 10 will operate as a regulated and stabilized system as though reference $V_r$ is the normal oscillator voltage. Furthermore, and as part of its operation, oscillator 10 (using FIG. 5 or 6) corrects for noise, distortion and provides all filtering operations in addition to its amplitude stability characteristics, whereby reference voltage $V_r$ now can be used in combination with voltage divider 69 to null meter 70 to measure $V_o$ potentiometrically.

Voltage divider 69 at the output of oscillator 10 adjusts the amplitude of $V_r'$ so that it is exactly matched against the amplitude of the voltage under test for the purpose of nulling meter 70. Should there be excessive variations in the reference voltage $V_r$ before applying same to oscillator 10, whereby the oscillator amplitude stabilization circuit is overpowered, a zener diode or other suitable amplitude limiting device 72 may be employed in the loop from system 68 to oscillator 10 to provide a fixed level reference voltage $V_r$ to oscillator 10. The high distortion which would result from an amplitude limiting device 72 is later automatically filtered out and stabilized by oscillator 10.

An illustrative bridge-oscillator employing the instant invention may be realized by use of the following: a variable bank of capacitors to provide a range of capacitance from 100 micro-micro-farads to 1000 micro-micro-farads for each capacitor 24, 27; a bank of resistors to provide resistance values for elements 25, 26 in steps of .08 megohm, .8 megohm and 8 megohms; a 6BR8 pentode-triode; a cathode resistor 18 of 75K ohms; a load impedance $Z_n$ of fixed value equal to about 2.4K ohms and a load impedance $Z_p$ equal to about 4.8K ohms. Although the illustrations herein have depicted electron vacuum tubes for the oscillator element 11 and the impedance load-phase inverter element 16, it will be understood that these elements may be replaced by equivalent transistors. Further, that the thermistor elements in FIGS. 2 through 3 may be replaced by equivalent elements serving as A.C. amplitude sensitive devices having a negative temperature coefficient of resistance when employed in the high gain voltage output and a positive temperature coefficient of resistance when employed in the high gain negative output.

The instant invention provides a pair of high gain voltages across arms $Z_p$ and $Z_n$ in contrast to the single output produced by the Wien-bridge oscillator. In the Wien-bridge oscillator, both tubes are employed as amplifiers; hence, overall system gain is a function of both tubes. This results in an overall reduction of bandwidth characteristics because each tube imposes its individual bandwidth constrictions on overall gain. In the instant invention, the second tube 16 is essentially a signal inverter and a matching impedance for loading the first tube 11 (the amplifier-oscillator) and to match same to the bridge circuit. Consequently, the system of the instant invention is a single tube system and this provides an overall system bandwidth response characteristic of a single tube amplifier circuit.

The system gain for an oscillator in accordance with the instant invention may be calculated by means of an equivalent circuit which is not developed herein because it is not necessary for an understanding and description of the invention. Such gain is a function of a gain of the first tube, $u_1$, in parallel with the product of the voltage across cathode resistor 18 of the second tube 16, E, times the transconductance of tube 11 times the gain of an equivalent tube, $u_2'$, serving as the load on tube 11 divided by the current, $I_1$, through tube 11, i.e.:

$$u_t = \frac{u_1 u_2' E \frac{gm_1}{I_1}}{u_1 + u_2' E \frac{gm_1}{I_1}} \quad (6)$$

For a 6BR9 pentode-triode, the foregoing values are as follows:

$gm_1 = 5200$ μmhos
$u_1 = 2080$
$rp_1 = 400,000$ ohms
$I_1 = 10$ ma.
$u_2 = 40$
let $E = 100$ volts The equivalent $u_2'$ can be related to the gain of tube 16 by the equivalent circuit theory mentioned above and for the foregoing, provides a value of about 20 so as to produce a total circuit gain of about 1000.

In the Wien-bridge oscillator, the two bridge terminals which correspond to junctions 22 and 34 of FIG. 1 are A.C. ground terminals. This means that the oscillator is biased through one of the bridge resistor arms, whereby the oscillator-cathode floats at a potential different than ground. In the instant invention, the oscillator-amplifier cathode is A.C. grounded. Consequently, separate D.C. coupled cathode-biasing means 12 may be employed to bias the cathode without loading down the bridge with the oscillator-amplifier tube current. This isolates the bridge from tube distortions and fluctuations that might be developed in the tube. Furthermore, in the instant invention, junction 28 is virtually at A.C. ground and junction 14 is the other A.C. ground. This permits the opposite bridge terminals 22, 34 to be used as the high gain terminals with respect to ground, whereby an oscillator in accordance with the invention is capable of two high gain output voltages. In the Wien-bridge oscillator, this arrangement is not possible since the latter two junctions of the prior art device are A.C. ground terminals.

Another additional benefit derived from the bridge arrangement as contemplated by the instant invention is that of stability which is implied in the foregoing discussion. As noted above, oscillator-amplifier 11, by virtue of the bridge arrangement, is biased by separate D.C. couple biasing means 12. This avoids the use of one of the bridge arm resistances as the cathode resistor which is typical of the Wien bridge. Furthermore, in the instant invention, the input to oscillator-amplifier 11 is a virtual A.C. ground of the bridge circuit. In contrast, the grid in the Wien-bridge arrangement is fed from the same junction, but this junction is not grounded. Consequently, in the instant invention, the bridge need not carry oscillator-amplifier tube currents and this results in a more accurate and stable operation in contrast to an arrangement where the feedback network is loaded down with the amplifier-tube currents. This distinguishing feature is further emphasized by the fact that in the instant invention , the output voltages are regulated by the ratio of the bridge arms $Z_p/Z_n$. Any regulation of $Z_n$ for regulating the output voltages effects the operation of the cathode circuit of the oscillator-amplifier in the Wien-bridge oscillator, since this arm of the bridge is the cathode-resistor.

In the prior art bridge oscillator, A.C. coupling is employed between the stages of the two tubes and between the second tube and the bridge network. This has the advantage of allowing each tube to be biased independently with respect to the other, however, at the expense of injecting phase shift errors into the system with the attending results of system unstabilities and inaccuracies. The instant invention contemplates D.C. coupling between the two tube elements and between the bridge and the tube circuit. Although this leads to passing the bias level of the amplifier-oscillator 11 into the next stage, the proper bias levels for the second stage is easily obtained by stable zener supply means 20 and 35; whereas, stable zener bias means 12 is employed in the first stage. As a result of D.C. coupling, the instant invention avoids sytem inaccuracies and unstabilities caused by A.C. coupling. In addition, and in particular at low frequency operation, the prior art bridge oscillator must overcome the difficulties attending the use of extremely large coupling capacitors, which problem is not present in the D.C. coupling bridge oscillator.

An additional achievement of the instant invention is that its circuit inherently corrects for variations in its D.C. supplies which would otherwise affect the magnitude of the output voltages. For example, should the B+ supply increase for some unaccountable reason to cause an increase of output levels because of a greater current flow through resistors 36 or 18, the increase D.C. drops across these resistors pull the D.C. level of junction 28 down or more negative with respect to ground, thereby increasing the negative potential level to grid 30 so as to return the outputs to their stabilized level.

It is intended that all matter contained in the above description or shown in the accompanying drawings shall be interpreted as illustrative and not in a limiting sense.

What is claimed is:

1. An oscillator system for generating electrical outputs comprising, a bridge network having first and second frequency selective bridge arms, said arms being connected at a first common junction, said arms having outer terminal ends, third and fourth impedance bridge arms connected at a second common junction and having outer terminal ends for electrical connection with individual ones of the outer terminal ends of said first pair of arms to define the third and fourth common junctions of said bridge, first amplifier means electrically coupled to said second common junction and having signal input means and signal output means for producing a signal at said signal output means which is of amplified magnitude of the signal fed into said signal input means, said signal input means being electrically coupled to said first common junction, said second common junction being grounded, second amplifier means having input means and second output means, said second output means being electrically coupled to said third common junction with respect to said fourth common junction, said first and second amplifier means being coupled to form a series connected amplifier, said first amplifier output means being coupled to said second amplifier input means for coupling a signal voltage at said first output means to said second input means to produce an output signal voltage at said second output means, said second amplifier means also being electrically coupled to said fourth common junction for applying the output voltage thereof across said third and fourth bridge junctions, said bridge and first amplifier means defining an electrical oscillator system and said bridge serving as a feedback network thereof, the portion of the bridge signal voltage appearing at said first common junction being fed to said first input means to sustain the system in oscillation, the third and fourth bridge arms sustaining individual output signal voltages, and the gain of one output signal with respect to the other output signal being a function of the impedance ratio of said third and fourth bridge arms.

2. A system as defined in claim 1 further including, means for regulating the value of said impedance ratio for stabilizing the magnitude of said output voltages at a constant value.

3. A system as defined in claim 1 for sensing the amplitude of one of said individual output signals for regulating oscillation to stabilize the magnitude of said output voltages at a constant value.

4. An oscillator for generating electrical outputs comprising, a plurality of interconnected impedance arms forming a bridge loop, a first pair of said arms being frequency selective and including a common connection therebetween comprising a first bridge junction, a second pair of said arms including a common connection therebetween comprising a second bridge junction, individual ones of the outer terminal ends of said first and second pairs being connected to form respectively third and fourth bridge junctions, said second bridge junction being the bridge ground, a series connected amplifier having first and second stages, each stage having respective signal input and signal output means including individual common terminal means, the input means for each stage including respective means for controlling signal current flow therethrough, first means for coupling said second stage signal output means to said bridge third junction with respect to said bridge fourth junction, second means for coupling said first stage signal input means to said bridge first junction with respect to bridge ground, and third means for coupling said first stage signal output means to said second stage signal input means for coupling the output voltage signal from said first stage to said second stage, whereby the output signal voltage of said second stage appears across said bridge third and fourth junctions, said bridge and said first stage defining an electrical oscillator system and said bridge serving as a feedback network thereof, the portion of the signal voltage appearing at said first bridge junction being fed to said first stage input means to sustain the system in oscillation, the individual bridge arms of said second pair sustaining individual output signal voltages, a first of said output signal voltages appearing at said bridge third junction and having a potential above bridge ground, the second of said output signal voltages appearing at said bridge fourth junction and having a potential below bridge ground.

5. A system as defined in claim 4 further including, means in the connection between said first stage common terminal means and said second bridge junction for providing a substantially zero impedance to A.C. signal flow therethrough and for applying a D.C. reference bias to said last-mentioned terminal means, means in the connection between said fourth bridge junction and said second stage common terminal means for providing a substantially zero impedance to A.C. signal flow therethrough and for applying a D.C. reference bias to said last-mentioned terminal means, said third means including means for providing a substantially zero impedance to the A.C. signal coupled to said second stage controlling means and for applying a D.C. bias thereto with respect to the bias applied to said second stage common terminal means.

6. A system as defined in claim 4, wherein the gain of one individual output signal voltage with respect to the other individual output signal voltage being a function of the impedance ratio of the individual bridge arms of said second pair, and means for regulating the value of said impedance ratio for stabilizing the magnitudes of said individual output signal voltages.

7. An oscillator for generating electrical outputs comprising, a plurality of interconnected impedance arms forming a bridge loop, a first pair of said arms being frequency selective for controlling the frequency of oscillation and including a common connection therebetween comprising a first bridge junction, a second pair of said arms including a common connection therebetween comprising a second bridge junction, individual ones of the outer terminal ends of said first and second pairs being connected to form respectively third and fourth bridge junctions, said second bridge junction being the bridge ground, a series connected amplifier having first and second stages, each stage having respective means for controlling signal current flow therethrough, each stage having common terminal means and also having respective signal output means, first means for coupling said second stage common terminal means to said bridge fourth junction, second means for coupling said second stage signal output means to said bridge third junction with respect to said bridge fourth junction, third means for coupling said first stage common terminal means to said bridge second junction, fourth means for coupling said first stage signal controlling means to said bridge first junction with respect to bridge ground and fifth means for coupling said first stage signal output means to said second stage signal controlling means for coupling the output voltage signal from said first stage to the input of said second stage, whereby the output signal voltage of said second stage appears across said bridge third and fourth junctions, said bridge and said first stage defining an electrical oscillator system and said bridge serving as a feedback network thereof, the portion of the bridge signal voltage appearing at said first bridge junction being fed to said first stage controlling means to sustain the system in oscillation, the individual bridge arms of said second pair of bridge arms sustaining individual output signal voltages, the gain of one of the last-mentioned output signals with respect to the other being a function of the impedance ratio of the individual bridge arms of said second pair, and amplitude stabilizing means operatively associated with one of the bridge arms of said second pair for sensing the A.C. signal sustained by said one bridge arm, said stabilizing means responding to magnitude variations of the sensed output signal by regulating the effective impedance of said one arm to adjust said impedance ratio, wherein the magnitude of the sensed signal voltage is maintained at a constant value.

8. A system as defined in claim 7, wherein said third means connection including means for providing a substantially zero impedance to A.C. signal flow therethrough and for applying a D.C. reference bias to said first stage, said first means including means for providing a substantially zero impedance to A.C. signal flow therethrough and for applying a D.C. reference bias to said second stage common terminal means, and said fifth means including means for providing a substantially zero impedance to the A.C. signal coupled to said second stage controlling means and for applying a D.C. bias to same with respect to the D.C. reference bias applied to said second stage common terminal means.

9. A system as defined in claim 8, wherein said means included in said first means connection being a regulated D.C. supply including a zener device.

10. An oscillator network for generating stabilized electrical outputs comprising, a bridge network having a first pair of frequency selective bridge arms, said arms being connected at a first bridge junction, said arms having outer terminal ends, said network having third and fourth bridge arms connected at a second bridge junction and having outer terminal ends for electrical connection with individual ones of the outer terminal ends of said first pair of arms to define third and fourth bridge junctions, said bridge second junction being grounded, first and second amplifier stages forming a series connected amplifier, each stage having respective signal input means and signal output means, means for coupling said first stage signal output means to said second stage signal input means, means for coupling said second stage signal output means across said bridge third and fourth junctions, means for coupling said first stage signal input means to said first bridge junction with respect to bridge ground for injecting a signal voltage into said first stage for sustaining system oscillation, said third and fourth bridge arms sustaining individual output signal voltages, the gain of one output signal voltage with respect to the other being a function of the impedance ratio of said third and fourth bridge arms, means in an electrical connection between said first stage and said bridge second junction for providing a substantially zero impedance to A.C. signal flow therethrough, said first bridge junction being virtually at an A.C. ground at bridge balance, and means included in at least one of said bridge arms of said second pair for regulating the value of the impedance ratio thereof for stabilizing the magnitude of said output voltage.

11. Means as defined in claim 8, wherein said stabilizing means being coupled to sense signal voltage sustained by the bridge impedance arm having an outer terminal end connected to the second stage output means of said stabilizing means including amplitude sensing means having a negative temperature coefficient of resistance connected across a load impedance to define a parallel combination bridge impedance arm the effective impedance of which is one of the impedances of said impedance ratio, an increasing output signal voltage sensed by said amplitude sensing means causes a compensating decrease of effective impedance of said one bridge arm to lower the in phase magnitude of feedback voltage at said first bridge junction, conversely a decreasing output signal voltage sensed by said amplitude sensing means causes a compensating increase of effective impedance of said one bridge arm to increase the in phase magnitude of feedback voltage at said first bridge junction, wherein said individual output signal voltages remain stabilized at a constant magnitude.

12. Means as defined in claim 11, wherein said amplitude sensing means including a thermistor element in series with a D.C. blocking capacitor, said series combination being shunted across said load impedance.

13. Means as defined in claim 8, wherein said stabilizing means being coupled to sense signal voltage sustained by the bridge impedance arm having an outer terminal end connected to said bridge fourth junction, said stabilizing means including amplitude sensing means having a positive temperature coefficient of resistance connected across a load impedance to define a parallel combination bridge impedance arm the effective impedance of which is one of the impedances of said impedance ratio, an increasing output signal voltage sensed by said amplitude sensing means causes a compensating increase of effective impedance of said one bridge arm to lower the in phase magnitude of feedback voltage at said first bridge junction, conversely a decreasing output signal voltage sensed by said amplitude sensing means causes a compensating decrease of effective impedance of said one bridge arm to increase the in phase magnitude of feedback voltage at said first bridge junction, wherein said individual output signal voltages remain stabilized at a constant magnitude.

14. Means as defined in claim 13, wherein said amplitude sensing means including a thermistor element in series with a D.C. blocking capacitor, said series combination being shunted across said load impedance.

15. A system as defined in claim 8 further including, amplitude sensing means operatively associated with a selected one of said bridge arms of said second pair for sensing the A.C. signal sustained by said selected one bridge arm, said amplitude sensing means including means for establishing a unidirectional fixed value of voltage having a polarity for bucking the signal voltage sustained by said selected one arm, the magnitude of said bucking voltage being designed to balance the stabilized signal voltage of said selected one arm, a short term fluctuation occurring in the sensed output signal voltage overcomes said bucking voltage to provide a regulating voltage which is a function of the magnitude that the fluctuation is greater than the bucking voltage, said amplitude sensing means including output means, and means in the last-mentioned output means for applying said regulating voltage as a feedback signal in out of phase relationship with respect to the in phase signal at said first bridge junction for suppressing said short term fluctuation.

16. A system as defined in claim 15, wherein said last-mentioned output means including filter means for filtering harmonic distortions at said last-mentioned output means from passing back into the oscillator circuit.

References Cited by the Examiner

UNITED STATES PATENTS 2,444,084 6/48 Artzt ---------------- 331—141

ROY LAKE, *Primary Examiner.*

JOHN KOMINSKI, *Examiner.*